United States Patent
Onishi et al.

(10) Patent No.: US 7,235,841 B2
(45) Date of Patent: Jun. 26, 2007

(54) SEMICONDUCTOR DEVICE

(75) Inventors: Yasuhiko Onishi, Nagano (JP);
Takeyoshi Nishimura, Nagano (JP);
Yasushi Niimura, Nagano (JP); Hitoshi Abe, Nagano (JP)

(73) Assignee: Fuji Electric Device Technology Co., Ltd. (JP)

( * ) Notice: Subject to any disclaimer, the term of this patent is extended or adjusted under 35 U.S.C. 154(b) by 0 days.

(21) Appl. No.: 10/973,946

(22) Filed: Oct. 26, 2004

(65) Prior Publication Data
US 2005/0145933 A1  Jul. 7, 2005

(30) Foreign Application Priority Data
Oct. 29, 2003  (JP) ............... 2003-369566

(51) Int. Cl.
*H01L 29/76* (2006.01)
*H01L 29/94* (2006.01)
*H01L 31/062* (2006.01)
*H01L 31/113* (2006.01)
*H01L 29/00* (2006.01)

(52) U.S. Cl. ............... 257/328; 257/329; 257/335; 257/341; 257/506

(58) Field of Classification Search ........ 257/328–329, 257/335, 341, 506
See application file for complete search history.

(56) References Cited

U.S. PATENT DOCUMENTS

| | | | |
|---|---|---|---|
| 4,754,310 A | 6/1988 | Coe | 357/13 |
| 5,216,275 A | 6/1993 | Chen | 257/493 |
| 5,438,215 A | 8/1995 | Tihanyi | 257/401 |
| 6,103,578 A * | 8/2000 | Uenishi et al. | 438/268 |
| 6,410,958 B1 * | 6/2002 | Usui et al. | 257/329 |
| 6,521,954 B1 * | 2/2003 | Kouzuki et al. | 257/374 |
| 6,849,900 B2 * | 2/2005 | Aida et al. | 257/341 |
| 6,878,989 B2 * | 4/2005 | Izumisawa et al. | 257/328 |

FOREIGN PATENT DOCUMENTS

| | | |
|---|---|---|
| JP | 2002-184985 A | 6/2002 |
| JP | 2002-280555 A | 9/2002 |

* cited by examiner

*Primary Examiner*—Sara Crane
*Assistant Examiner*—Samuel A. Gebremariam
(74) *Attorney, Agent, or Firm*—Rossi, Kimms & McDowell LLP (57) ABSTRACT

A semiconductor device includes an active region, an alternating conductivity type layer, and an insulation region surrounding the alternating conductivity type layer provided in a periphery section as a voltage withstanding section. The insulation region is made of an insulator with the critical electric field strength higher than that of the semiconductor and reaches an $n^+$-drain layer on the bottom surface side of the device from a surface on the side on which a surface structure section is formed. In the alternating conductivity type layer, the width of the p-type partition region adjacent to the insulation region is made narrower than the width of the p-type partition region not adjacent to the insulation region to ensure a balanced state of charges at the end of the drift section made up of the alternating conductivity type layer. A high breakdown voltage is ensured with the length of the periphery section shortened.

16 Claims, 11 Drawing Sheets

SEMICONDUCTOR DEVICE

BACKGROUND OF THE INVENTION

The present invention relates to a vertical power semiconductor device in which breakdown voltage enhancement is compatible with current capacity enhancement.

In general, semiconductor devices may be roughly classified into lateral devices each having electrode sections only on one side and vertical elements each having electrode sections on both sides. In a vertical device, both the direction in which a drift current flows in an on-state and the direction in which a depletion layer formed by a reverse bias voltage extends are in the direction of the thickness of a substrate (i.e. the vertical direction). For example, in an ordinary planer n-channel vertical MOSFET (metal oxide silicon field effect transistor), a high resistance $n^-$-drift layer is operated as a region for flowing a drift current in the vertical direction when the MOSFET is in an on-state. While, when in an off-state, the $n^-$-drift layer is depleted for an operation of enhancing a breakdown voltage.

Reduction in the thickness of the high resistance $n^-$-drift layer, i.e. reduction in a current path length, lowers drift resistance in an on-state, which results in an effect of a reduction in substantial on-resistance (drain-source resistance) of the MOSFET. In an off-state, however, a width of a depletion layer between the n-drain and the p-base, expanding from the pn-junction between a p-base region and the $n^-$-drift layer, is narrowed to cause an electric field strength of the depletion layer to quickly reach the maximum (critical) electric field strength of silicon. That is, breakdown is caused before the drain-source voltage reaches the design value of the breakdown voltage of the device. This results in reduction in the breakdown voltage (drain-source voltage).

Contrary to this, a thickly formed $n^-$-drift layer can provide a high breakdown voltage. This, however, inevitably increases on-resistance to increase a power loss in the on-state. In this way, there is a tradeoff relationship between the on-resistance (current capacity) and the breakdown voltage. The relationship is also known to be similarly held in a semiconductor device with a drift layer such as an IGBT (insulated gate bipolar transistor), a bipolar transistor and a diode. A commonly known solution to this problem is to provide a semiconductor device with a drift layer provided as a alternating conductivity type layer in which n-type regions and p-type regions both with increased impurity concentrations are alternatingly joined into multi-junctions.

The structural difference between the above semiconductor device and an ordinary planar n-channel type vertical MOSFET is that the drift layer of the above semiconductor device is not made up of a uniform single conductive layer (impurity diffused layer) but made up of alternating conductivity type layer in which vertical n-type drift regions and vertical p-type partition regions are alternately joined into multi-junctions. Even though the impurity concentrations in the alternating conductivity type layer are high, in an off-state, a depletion layer expands in both lateral directions from each pn junction orientated in the vertical direction of the alternating conductivity layer to make the whole drift layer depleted. Thus a high breakdown voltage can be provided. A semiconductor device provided with a drift layer with such a alternating conductivity type layer is referred to as a super junction semiconductor device.

In the super junction semiconductor device, a device as disclosed in, for example, JP-A-2002-280555 is publicly known in which a voltage withstanding structure around the drift layer is provided as the alternating conductivity type layer. Along with this, in the device, an n-type region is disposed around the alternating conductivity type layer for separating a p-type region formed in the outermost periphery section and a p-type region in the alternating conductivity type layer as the voltage withstanding structure. This is for significantly reducing a leak current in an off-state and, along with this, for increasing reliability of breakdown voltage. Moreover, a semiconductor device as disclosed in, for example, JP-A-2002-184985 is publicly known. The device provides an electrode positioned some distance away from an end of a structure with a first semiconductor region of a first conductivity type and a second semiconductor region of a second conductivity type alternately arranged on a semiconductor substrate. The electrode is also made in electrical conduction with the second semiconductor region forming a periphery section. Thus, it is possible to obtain a breakdown voltage nearly equal to that of a planar junction.

As explained above, in a super junction semiconductor device, for improving a breakdown voltage, a periphery section to become a voltage withstanding structure is provided on the outside of an active section having an alternating conductivity type layer. The periphery section becomes an inactive region when the device is in an on-state. For miniaturizing a semiconductor chip having the super junction semiconductor, a length from the boundary between the active section and the periphery section to the end of the periphery section, that is, a length to the edge of the semiconductor chip is preferably the shortest possible. In the device disclosed in the above JP-A-2002-280555, however, the main object is to reduce a leak current in an off-state and therefore no consideration is given to shortening the length of the periphery section. Also in the device disclosed in the above JP-A-2002-184985 with the main object thereof being to make the device provide a high breakdown voltage, no consideration is given to shortening the length of the periphery section.

In view of the foregoing, it would be desirable to provide a semiconductor device having a alternating conductivity type layer, provided with a high breakdown voltage, and having an periphery section with a short length to be a voltage withstanding structure.

SUMMARY OF THE INVENTION

A semiconductor device according to a first aspect of the invention includes a first principal surface, a second principal surface, a low resistance layer provided between the first principal surface and the second principal surface, and an alternating conductivity type layer in which first conductivity type regions and second conductivity type regions are alternately arranged in a lateral direction in parallel with the first and second principal surfaces, the alternating conductivity type layer being surrounded by an insulation region reaching the low resistance layer from the first principal surface.

According to the first aspect of the invention, an insulator film such as an oxide film or a nitride film forming the insulation region carries a voltage with an electric field strength equal to or below the breakage electric field strength of the insulator film. Therefore, it becomes possible to maintain a breakdown voltage without lowering the breakdown voltage of the drift layer made up of the alternating conductivity type layer. At the time, formation of the insulation region by using an insulator with a critical electric field strength thereto higher than that to a semiconductor makes it possible to shorten the length of the periphery section, namely to shorten the length from the boundary between the active section and the periphery section to the end of the device.

A semiconductor device according to a second aspect of the invention is a device in which, in the device according to the first aspect of the invention, the first conductivity type region or the second conductivity type region adjacent to the insulation region in the alternating conductivity type layer has a width narrower than a width of a region with the same conductivity type not adjacent to the insulation region in the alternating conductivity type layer.

A semiconductor device according to a third aspect of the invention is a device in which, in the device according to the second aspect of the invention, the first conductivity type region or the second conductivity type region adjacent to the insulation region in the alternating conductivity type layer has a width between one-fourth and three-fourths the width of the region with the same conductivity type not adjacent to the insulation region in the conductivity type layer.

According to the second aspect or the third aspect of the invention, a balanced state of charges can be ensured at the end of the drift layer made up of the alternating conductivity type layer to easily ensure a high breakdown voltage.

A semiconductor device according to a fourth aspect of the invention is a device in which, in the device according to any one of the first aspect to the third aspect of the invention, a part of the insulation region is covered with a field plate electrode.

According to the fourth aspect of the invention, a lateral electric field generated at the boundary between the insulation region and the alternating conductivity type layer can be reduced to make it possible to provide a high breakdown voltage.

A semiconductor device according to a fifth aspect of the invention is a device in which, in the device according to any one of the first aspect to the fourth aspect of the invention, a base region with the second conductivity type provided on the side of the first principal surface is in contact with the side of the insulation region.

According to the fifth aspect of the invention, a high electric field, generated at a section with a curvature in the second conductivity type region formed in the semiconductor, can be reduced to make it possible to easily provide a high breakdown voltage.

A semiconductor device according to a sixth aspect of the invention is a device in which, in the device according to any one of the first aspect to the fifth aspect of the invention, the insulation region is surrounded by a periphery region with the first conductivity type.

A semiconductor device according to a seventh aspect of the invention is a device in which, in the device according to the sixth aspect of the invention, the periphery region is in contact with the low resistance layer.

A semiconductor device according to an eighth aspect of the invention is a device in which, in the device according to the sixth aspect or the seventh aspect of the invention, a region with the second conductivity type is provided between the periphery region and the first principal surface.

A semiconductor device according to a ninth aspect of the invention is a device in which, in the device according to any one of the sixth aspect to the eighth aspect of the invention, a part of the insulation region is covered with an electrode at an electric potential equal to that of the low resistance layer.

According to the sixth aspect to the ninth aspect of the invention, the electric potential at the outermost periphery section becomes equal to that of the low resistance layer to fix the electric potential of the insulation layer, so that the breakdown voltage can be made stabilized.

According to the semiconductor device of the invention, there is a periphery section on the outside of an active section having an alternating conductivity type layer. In the periphery section, there is an insulation region that maintains a breakdown voltage in the periphery section. Therefore, even though the length of the periphery section is short, a required breakdown voltage can be ensured. Moreover, balanced charges are maintained at the end region of the alternating conductivity type layer to make it possible to easily ensure the breakdown voltage. Therefore, in a semiconductor device having the alternating conductivity type layer, there is given effects of making it possible to ensure a high breakdown voltage and along with this, to shorten the length of the periphery section. In other words, in the semiconductor device having the alternating conductivity type layer, there is given an effect of making it possible to ensure a high breakdown voltage even though the length of the element periphery section is short.

BRIEF DESCRIPTION OF THE DRAWINGS

The invention will be described with reference to the following detailed description of the preferred embodiments of the invention and the accompanying drawings, wherein.

DESCRIPTION OF THE PREFERRED EMBODIMENT

In the following, preferred embodiments of the semiconductor device according to the invention will be explained in detail with reference to the attached drawings. In the following explanations and the attached drawings, layers or regions named with a leading character or denoted by a character "n" or "p" mean that electrons or holes, respectively, are carriers in the layers or the regions. Moreover, a sign "+" or "−" attached to the character "n" or "P" represents that the impurity concentrations of the respective carriers are comparatively high or comparatively low, respectively. Furthermore, in all of the drawings, similar arrangements are denoted with the same reference numerals and signs with redundant explanations being omitted.

Embodiment 1

Figure 1:
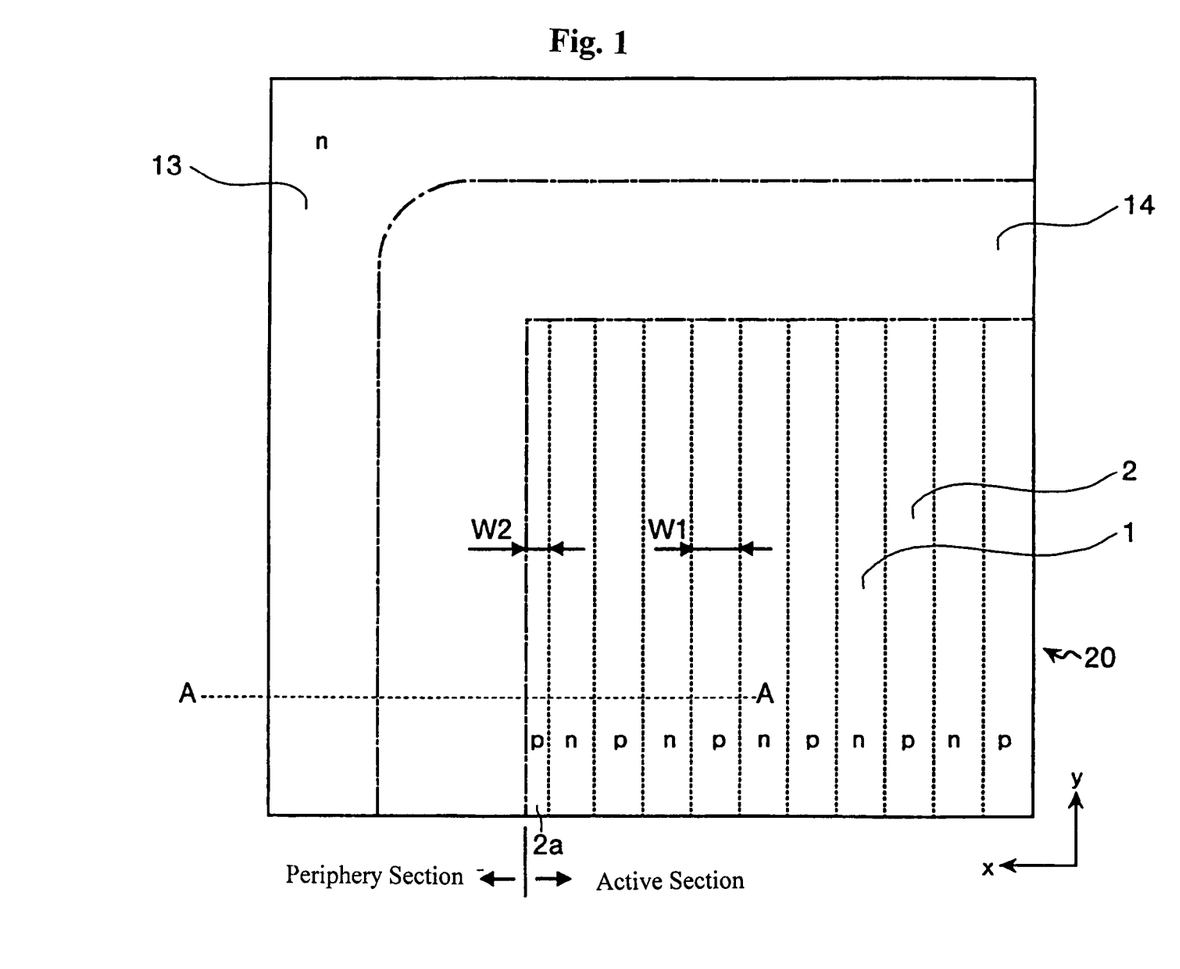
FIG. 1 is a partial plan view showing a chip of a vertical MOSFET according to a first embodiment of the invention.
Figure 2:
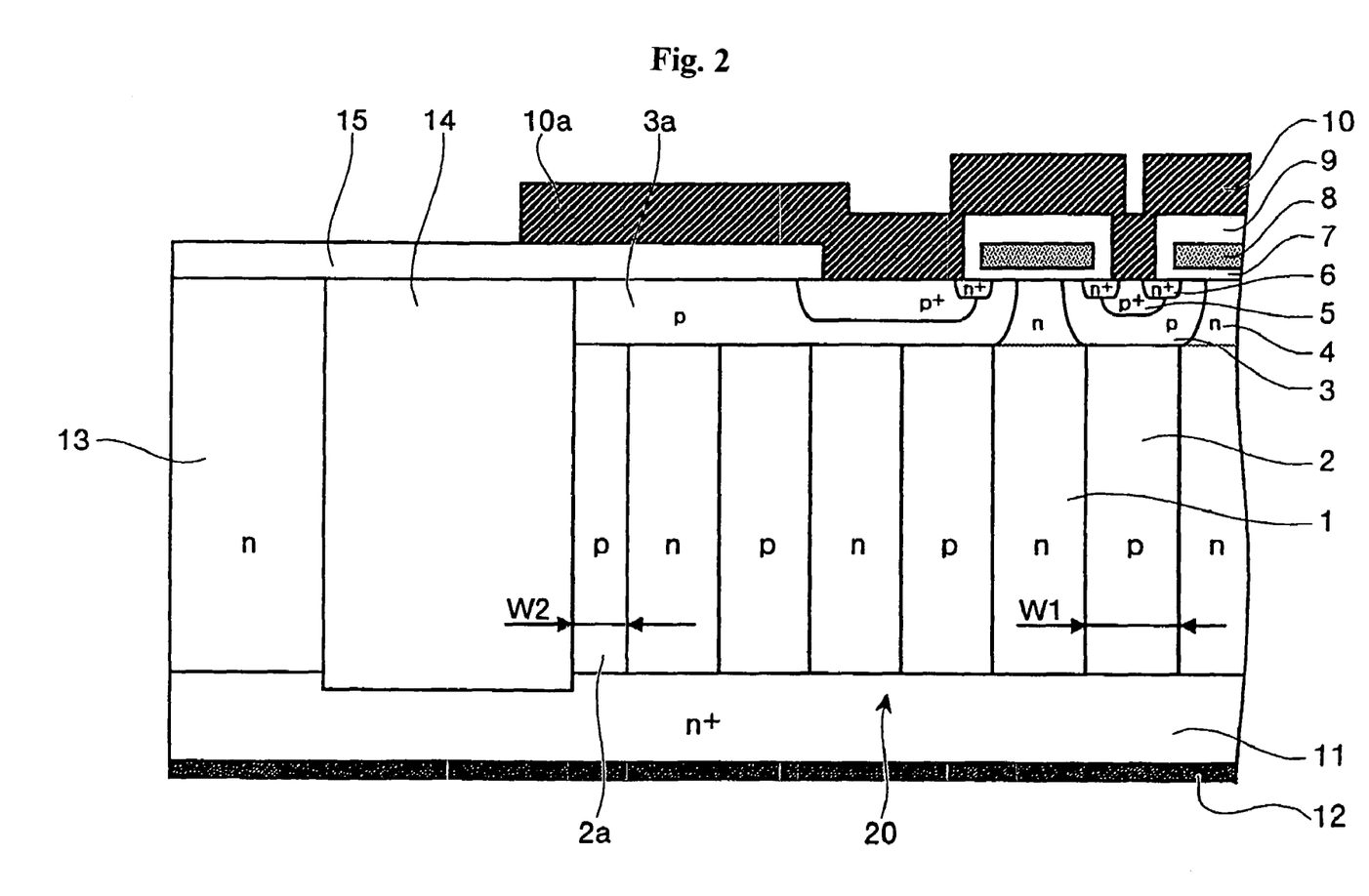
FIG. 2 is a cross sectional view showing a state of the chip cut along line A—A in FIG. 1.

FIG. 1 is a schematic view showing a chip of a vertical MOSFET according to an embodiment 1 of the invention, which is a partial plan view showing a section to which a square chip is divided into quarters. For easing understanding, only an alternating conductivity type layer (in dotted lines), an insulation region (in chain lines) surrounding the alternating conductivity type layer, and an n-type region (outside of the outer chain line) in an outermost periphery are shown. FIG. 2 is a cross sectional view showing a section cut along line A—A in FIG. 1. In the following explanations, for the sake of convenience, a direction in which n-type drift regions 1 and p-type partition regions 2 are alternately aligned is taken as the x-direction. Moreover, a direction in which the n-type drift regions 1 and the p-type partition regions 2 extend is taken as the y-direction. The x-direction and the y-direction are, unless otherwise specified, taken as the same in other embodiments.

As shown in FIG. 2, in an active section, there are formed semiconductor devices such as MOSFETs. A periphery section is provided on the outside of the active section and becomes a voltage withstanding structure. On the surface (a first principal surface of a substrate) side of the surface in the active section, there are formed a surface structure with n-channel MOSFETs. Each n-channel MOSFET includes a p-base region 3, a p$^+$-contact region 5, an n$^+$-source region 6, a gate electrode 8, an interlayer insulator film 9 and a source electrode 10. On the bottom surface side of the device, an n$^+$-drain layer 11 as a low resistance layer is provided over the active section and the periphery section. On the bottom surface of the device, a drain electrode 12 is provided to be in conductive contact with the n$^+$-drain layer 11. The method of manufacturing semiconductor devices such as the MOSFET is as well-known.

In the active section, a drift layer between the surface structure with MOSFETs and the n$^+$-drain layer 11 is made up of a stripe-pattern-like alternating conductivity type layer 20. The alternating conductivity type layer 20 includes, for example, the vertical-layer-like n-type drift regions 1 as first conductivity type regions and the vertical-layer-like p-type partition regions 2 as second conductivity type regions are alternately arranged with each other. In the element surface structure, an extended region of the n-type drift region 1 between the p-base regions 3 or between the p-base region 3 and a p-base region 3a is a surface n-type drift region 4. The surface n-type drift region 4 is an n-channel region into which carriers (electrons) are injected from the n$^+$-source region 6 through an inversion layer induced on the surface of the p-base region 3 or 3a just below the gate electrode 8 when the MOSFET is brought into an on-state.

In manufacturing the alternating conductivity type layer 20, epitaxial growth of n-type semiconductor material and ion implantation of p-type impurities can be alternately carried out until the thickness of the alternating conductivity type layer reaches a desired one. As another approach, the trenches can be formed in an n-type epitaxial growth layer with a desired thickness for filling the trenches with p-type epitaxial growth layers to thereby form the alternating conductivity type layer 20.

In the periphery section, there are provided an n-type periphery region 13 and an insulation region 14. The insulation region 14 surrounds the alternating conductivity type layer 20 and reaches the n$^+$-drain layer 11 from the first principal surface of the substrate. In the x-direction, the insulation layer 14 is in contact with a p-type partition region 2a on the outermost side of the alternating conductivity type layer 20. The width W2 of the p-type partition region 2a adjacent to the insulation region 14 is narrower than the width W1 of the p-type partition region 2 not adjacent to the insulation region 14. The width W2 is preferably between one-fourth and three-fourths the width W1. In the embodiment shown in FIG. 1 and FIG. 2, W2 is about a half of W1.

Moreover, with a part of the side face of the insulation layer 14 on the side of the active region, the p-base region 3a is in contact which is positioned on the outermost side in the active region. On the insulation region 14, there is an insulating surface protection film 15 made up of material such as an oxide film. The source electrode 10 extends on the surface protection film 15 from the element active section to above a part of the insulation region 14 through over the p-base region 3a adjacent to the insulation region 14 to be a field plate electrode 10a. The n-type periphery region 13 is provided on the further outside of the insulation region 14, that is, at the outermost section of the chip, to be in contact with the n$^+$-drain layer 11. The insulation region 14 is provided by forming, for example, a trench in the periphery section so as to surround the active section and by filling the trench with an insulator film such as an oxide film or a nitride film.

As an example of the embodiment, when the embodiment is applied to a 500V class power MOSFET, dimensions and impurity concentrations of various parts in the MOSFET are presented as follows. A thickness of a drift layer is 35.0 μm. Here the thickness of the drift layer is a thickness from a boundary between the gate insulator film 7 and the n-type drift region 1 including the surface n-type drift region 4 to a boundary between the n-type drift region 1 and the n$^+$-drain layer 11. That is, it is the thickness of the alternating conductivity type layer 20 immediately after the alternating conductivity type layer 20 is manufactured.

Each of the n-type drift region 1 and the p-type partition region 2 has a width of 8.0 μm. The p-type partition region 2a in contact with the insulation region 14 has a width of 4.0 μm. Each of the n-type drift region 1 and the p-type partition regions 2 and 2a has an impurity concentration of $2.0 \times 10^{15}$ cm$^{-3}$. When the insulation region 14 is made of an oxide film, the insulation region 14 has a width of 20.0 μm. Furthermore, the insulation region 14 has a depth of 37.0 μm. The n-type periphery region 13 has a width of 20.0 μm and an impurity concentration of $6.0 \times 10^{15}$ cm$^{-3}$. Each of the p-base regions (p-well regions) 3 and 3a has a diffusion depth of 3.0 μm and a surface impurity concentration of $3.0 \times 10^{17}$ cm$^{-3}$.

The n$^+$-source region 6 has a diffusion depth of 1.0 μm and a surface impurity concentration of $3.0 \times 10^{20}$ cm$^{-3}$. The surface n-type drift region 4 has a diffusion depth of 2.5 μm and a surface impurity concentration of $2.0 \times 10^{16}$ cm$^{-3}$. The n$^+$-drain layer 11 has an impurity concentration of $2.0 \times 10^{18}$ cm$^{-3}$ and a thickness of 200 μm. The dimensions and the impurity concentrations of the regions and parts are not limited to the above-explained values. Moreover, the class of the breakdown voltage is also not limited to the 500V class.

As explained above, by surrounding the alternating conductivity type layer 20 with the insulation region 14, the area efficiency of the semiconductor device can be significantly improved to make it possible to manufacture a small-sized semiconductor device. The reason for this is as follows. When a reverse voltage is applied to the device, an electric potential is distributed from the drift section made up of the alternating conductivity type layer 20 to the surface side through the insulation region 14. Therefore, at the periphery section, the applied reverse voltage is to be carried by the insulation region 14.

For example, assume that the insulation region 14 is made of an oxide film. The critical electric field strength of the oxide film is about one order of magnitude higher than the critical electric field strength of silicon. Therefore, by providing the insulation region 14 of an oxide film in the periphery section, a required breakdown voltage can be ensured with a width a half or below the width of a related structure in which the periphery section is made of silicon. For example, in the case of a device in the 500V class, in a related device with the periphery section made of silicon, the length of the periphery section is on the order of 150 μm. Compared with this, in an device having the insulation region 14 made of an oxide film, the length of the periphery section can be shortened to on the order of 40 μm. That is, the length of the element periphery section can be shortened to a length equal to a sum of the width of the insulation region 14 of 20 μm and the width of the n-type periphery region 13 of 20 μm. Thus, the area efficiency is to be significantly improved.

In the invention, the insulation region 14 formed deeper than the n-type drift region 1 and the p-type partition region 2 make it possible to obtain the highest breakdown voltage. In the case of the insulation layer 14 reaching down to the $n^+$-drain layer 11, no portion with a high local electric field strength is formed in an super junction structure to make it possible to obtain a breakdown voltage nearly equal to that in a plain junction structure.

Figure 10:
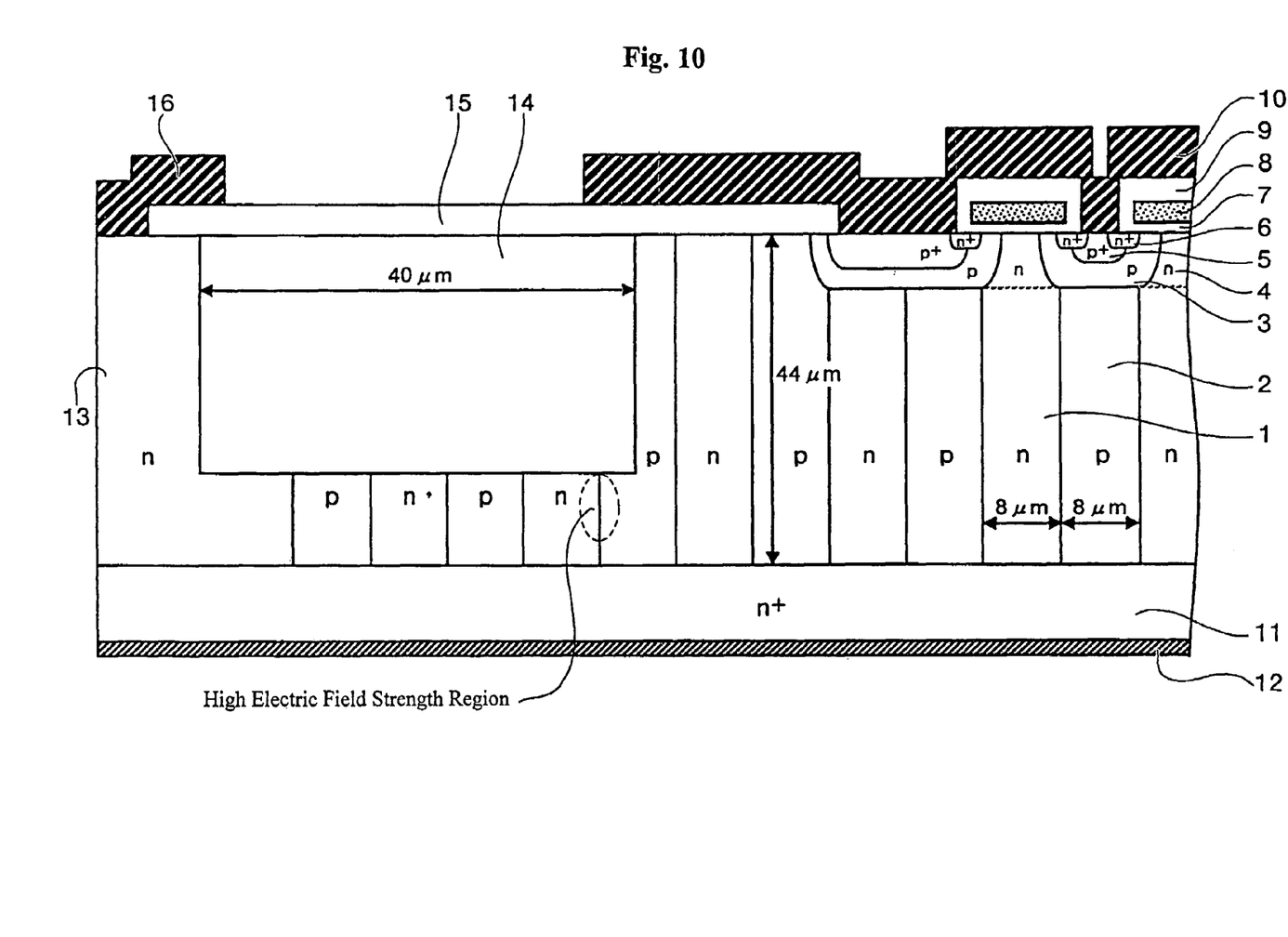
FIG. 10 is a cross sectional view showing a case with an insulating region shallower than n-drift regions and p-partition regions.
Figure 11:
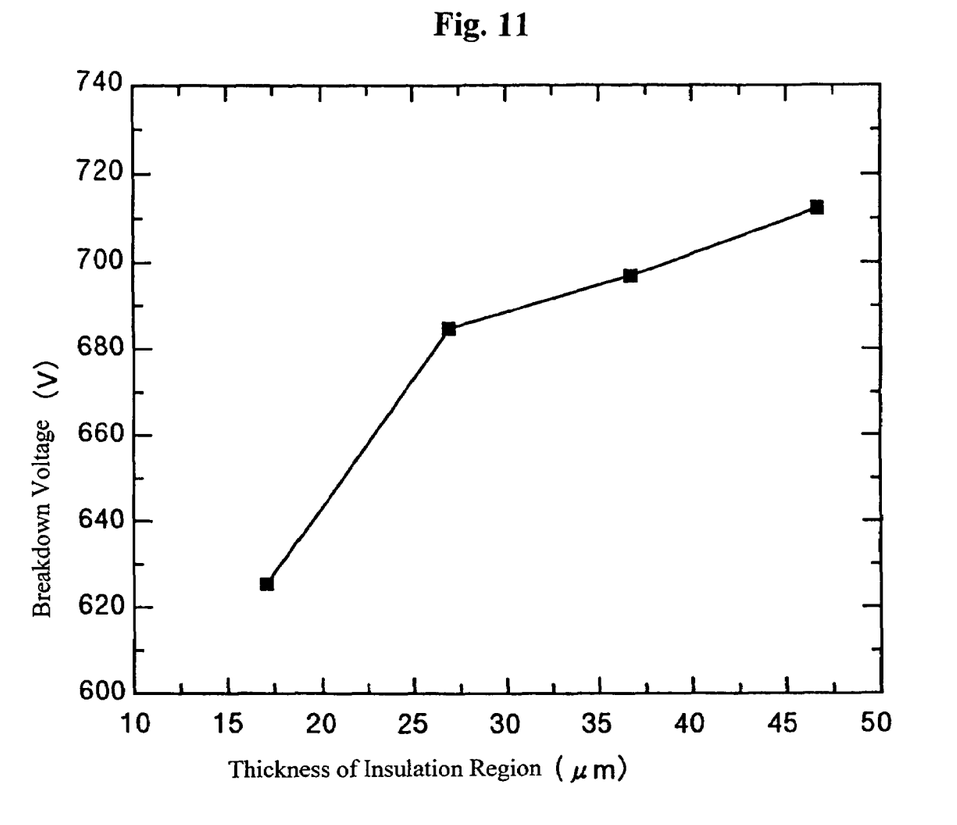
FIG. 11 is an explanatory diagram showing a result of simulation about a relationship between a thickness of the insulation region and a breakdown voltage in the structure of FIG. 10.

As shown in FIG. 10, when the insulation region 14 is shallower than the n-type drift region 1 and the p-type partition region 2 (when the alternating conductivity type layer 20 is partially extended toward outside to be presented as a parallel pn-layer between the insulation layer 14 and the $n^+$-drain layer 11), the breakdown voltage is reduced as the thickness of the insulation region 14 is reduced. This is because the electric field strength partially becomes high (reaches the critical electric field strength) at the outer periphery side end of the p-region in the parallel pn-layer under the insulation region 14. This becomes more significant as the insulation region 14 decreases in thickness. In FIG. 11, there is shown a relationship between the thickness of the insulation region 14 and the breakdown voltage in the structure shown in FIG. 10 as a result of simulation. Incidentally, the insulation region 14 with an increased thickness can ensure a sufficiently high breakdown voltage. Thus, the insulation region 14 is not necessarily made thicker than the parallel pn-layer. In the case of a substrate having a thickness with a sufficient allowance for a breakdown voltage, the breakdown voltage can be ensured even with the insulation region 14 with a thickness less than that of the parallel pn-layer.

Furthermore, as explained above, presence of the field plate electrode 10a can further increase the breakdown voltage. The reason is that the avalanche breakdown occurs at the p-base region 3a at a boundary under a high electric field strength between the insulation region 14 and the alternating conductivity type layer 20, and the application of the field plate structure to the boundary can reduce the electric field strength at the boundary.

Moreover, as explained above, the width W2 of the p-type partition region 2a adjacent to the insulation region 14 is between one-fourth and three-fourths the width W1 of the p-type partition region 2 not adjacent to the insulation region 14. This makes it possible to restrict variation in the breakdown voltage low. The reason is as follows. The alternating conductivity type layer 20 can ensure the highest breakdown voltage with charges therein being made balanced. Therefore, the width of the p-type partition region 2a adjacent to the insulating region 14 must be adjusted to a width for making the charges therein balanced with those in the p-type partition region 2. In the embodiment, all of the p-type partition regions 2 and 2a are made to have the same impurity concentration. This brings the charges to be in a balanced state when the width of the p-type partition region 2a adjacent to the insulating region 14 is about a half the width of the p-type partition region 2 not adjacent to the insulation region 14.

Furthermore, with the width of the p-type partition region 2a in contact with the insulation region 14 made equal to or less than ±50% of the width as the condition of making the charges balanced, that is, made to be 25 to 75% of the width of the p-type partition region 2 not in contact with the insulation region 14, variation in the breakdown voltage due to unbalanced charges can be restricted low. About the y-direction, because of the alternating conductivity type layer 20 provided like stripes in parallel with the y-direction, no problem due to unbalanced charges is to occur between the insulation region 14 and the end of the alternating conductivity type layer 20.

Embodiment 2

Figure 3:
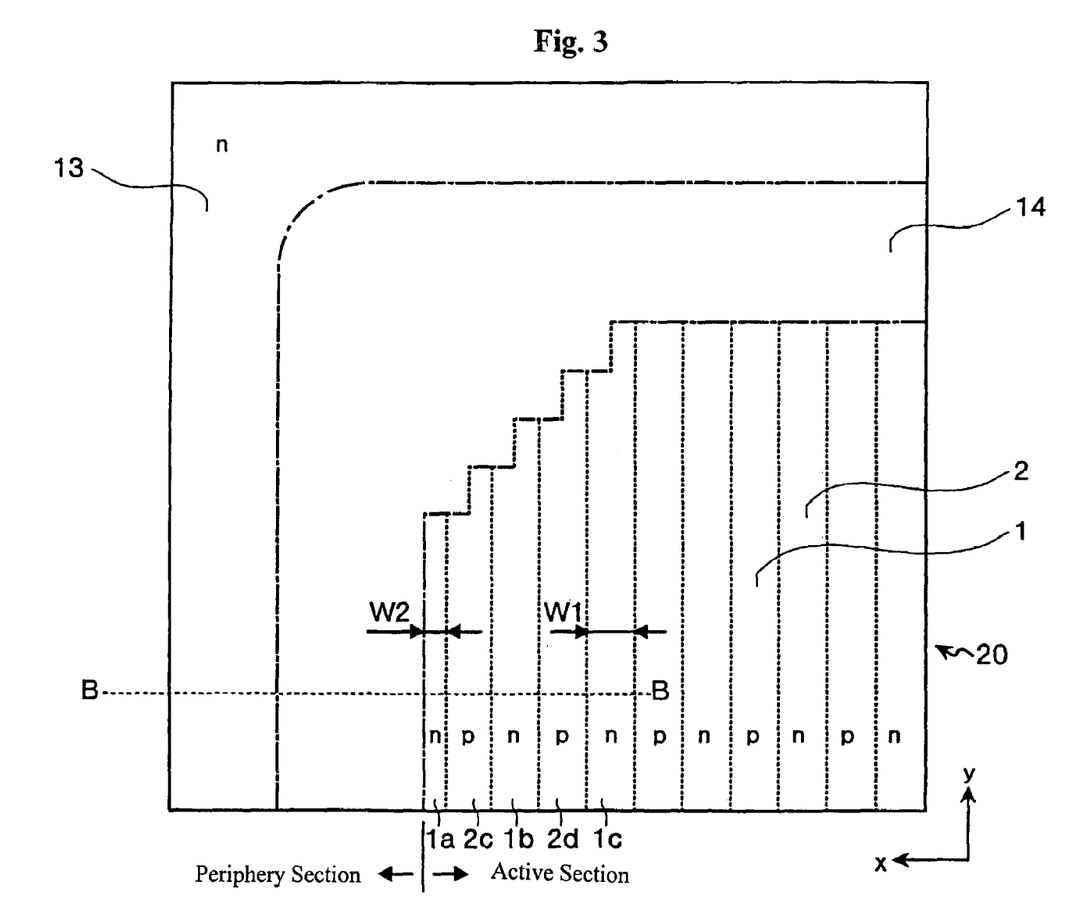
FIG. 3 is a partial plan view showing a chip of a vertical MOSFET according to a second embodiment of the invention.
Figure 4:
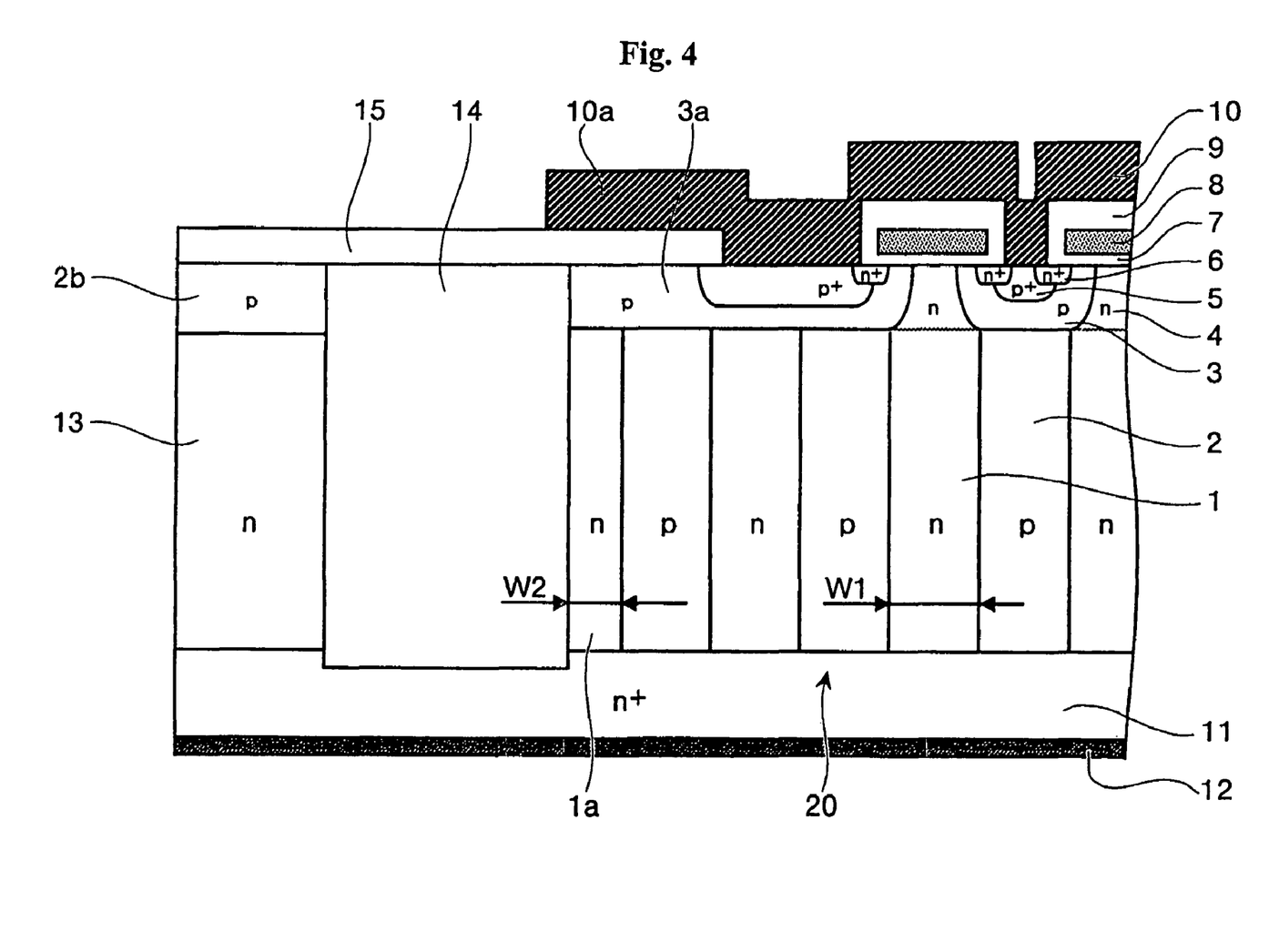
FIG. 4 is a cross sectional view showing a state of the chip cut along line B—B in FIG. 3.

FIG. 3 is a schematic view showing a chip of a vertical MOSFET according to an embodiment 2 of the invention, which is a partial plan view showing a section to which a square chip is divided into quarters. For easing understanding, there are only shown a alternating conductivity type layer (in dotted lines), an insulation region (in chain lines) surrounding the alternating conductivity type layer, and an n-type region (outside of the outer chain line) in an outermost periphery. FIG. 4 is a cross sectional view showing a section cut along line B—B in FIG. 3. As shown in FIG. 3 and FIG. 4, it is in the following three points that the embodiment 2 differs from the embodiment 1.

The first point is that the alternating conductivity type layer 20 has a plan shape in which a part facing a corner of the chip is formed in a stair-like shape. The second point is that an n-type drift region 1a is made positioned on the outermost side of the alternating conductivity type layer 20 in the x-direction, and an insulation region 14 is in contact the n-type drift region 1a in the x-direction. The third point is that, on the top surface side of the n-type periphery region 13, a p-type region 2b as a second conductivity type region is formed.

An explanation will be made about the above first point. The plan shape of the part facing the corner of the chip in the parallel pn structure 20 is, though not limited to in particular, is formed as follows in the example shown in FIG. 3, for example. The extending length in the y-direction of the n-type drift region 1a adjacent to the insulation region 14 is the shortest. The one with the second shortest extending length in the y-direction is a p-type partition region 2c adjacent to the n-type drift region 1a. The one with the short extending length in the y-direction next to the p-type partition region 2c is an n-type drift region 1b adjacent to the p-type partition region 2c. The one with the short extending length in the y-direction next to the n-type drift region 1b is a p-type partition region 2d adjacent to the n-type drift region 1b. Then, the extending length in the y-direction of an n-type drift region 1c adjacent to the p-type partition region 2d is the same as those of the n-type drift regions 1 and the p-type partition region 2 inside the n-type drift region 1c in the x-direction.

However, an outer half part in the x-direction of the p-type partition region 2c, that is, a part with the width about a half of that of the region 2c on the side in contact with the n-type drift region 1a extends in the y-direction only to the length the same as that of the n-type drift region 1a. Similarly, a part of the n-type drift region 1b with the width about a half of that of the region 1b on the outer side in the x-direction extends in the y-direction only to the length the same as that of the p-type partition region 2c. The same is true for the p-type partition region 2d and an outer part thereof with the width about a half of that of the region 2d extends in the y-direction only to the length the same as that of the n-type drift region 1b. The same is true for the n-type drift region 1c and an outer part thereof with the width about a half of that of the region 1c extends in the y-direction only to the length the same as that of p-type partition region 2d.

With the alternating conductivity type layer 20 formed in such a plan shape, a plurality of planar corners of the alternating conductivity type layer 20 are to be formed. This lessens electric field strength at each of the planar corners of the alternating conductivity type layer 20 to make it possible to easily ensure a required breakdown voltage. Contrary to this, in the arrangement of the embodiment 1, a single planar corner of the alternating conductivity type layer is liable to increase electric field strength.

An explanation will be made about the above second point. The width W2 of the n-type drift region 1a adjacent to the insulation region 14 is narrower than the width W1 of the n-type drift region 1 not adjacent to the insulation region 14. The width W2 is preferably between one-fourth and three-fourths the width W1. In the embodiment shown in FIG. 3 and FIG. 4, W2 is about a half of W1. This is, as was explained about the embodiment 1, for making charges balanced. Moreover, the reason that outer half parts of the above-described p-type partition region 2c, n-type drift region 1b, p-type partition region 2d and n-type drift region 1c extend only to the lengths equal to those of the n-type drift region 1a, p-type partition region 2c, n-type drift region 1b and p-type partition region 2d in contact with the outside faces of the p-type partition region 2c, n-type drift region 1b, p-type partition region 2d and n-type drift region 1c, respectively, is also for making charges balanced in the respective parts adjacent to the insulation region 14 in the x-direction in the n-type drift regions 1b and 1c and the p-type partition regions 2c and 2d.

An explanation will be made about the above third point. Since no current flows in the n-type periphery region 13 unless the breakage of the oxide film occurs, it does not matter if the p-type region 2b is formed on the surface of the n-type periphery region 13. When forming no p-type region 2b, a process for covering the n-type periphery region 13 by a resist mask becomes necessary. However, formation of the p-type region 2b makes the process unnecessary to make it possible to reduce process cost. Even with this arrangement, the necessary breakdown voltage can be ensured.

Embodiment 3

Figure 5:
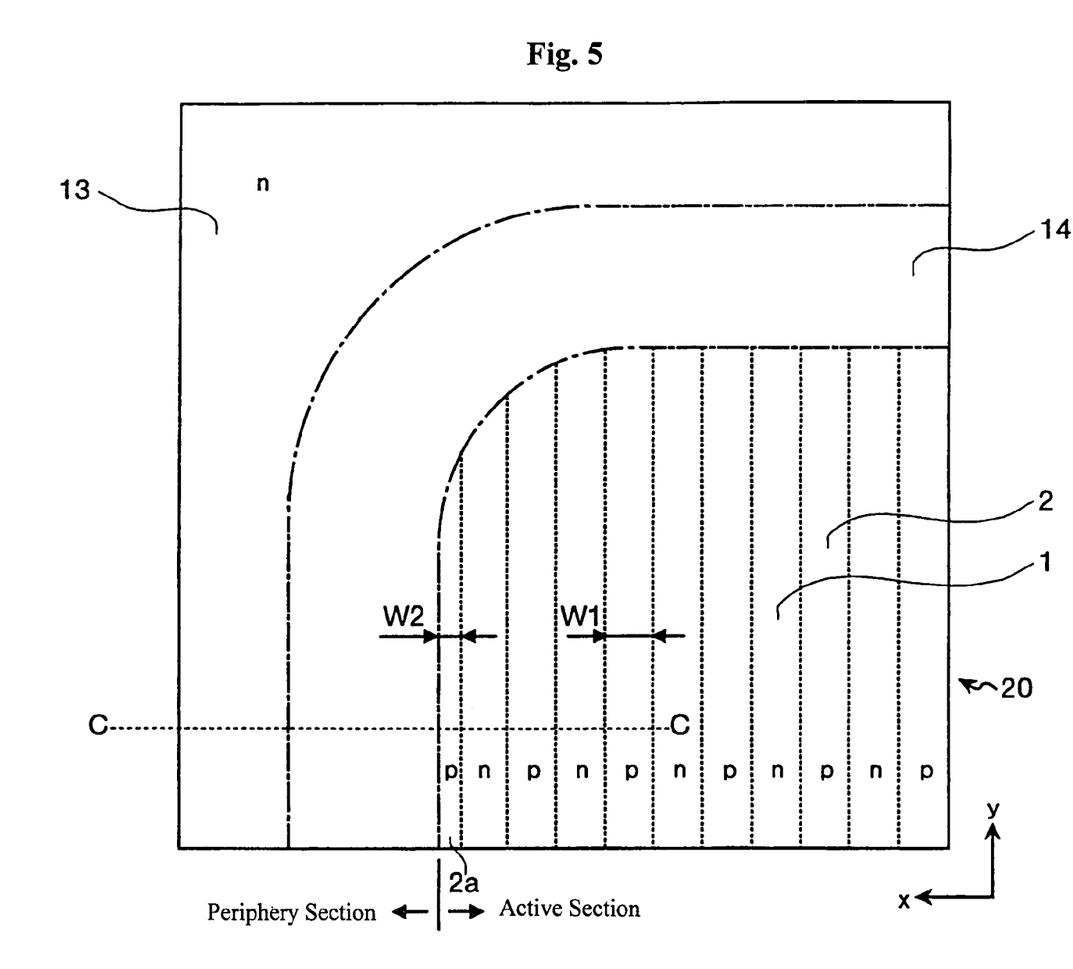
FIG. 5 is a partial plan view showing a chip of a vertical MOSFET according to a third embodiment of the invention.
Figure 6:
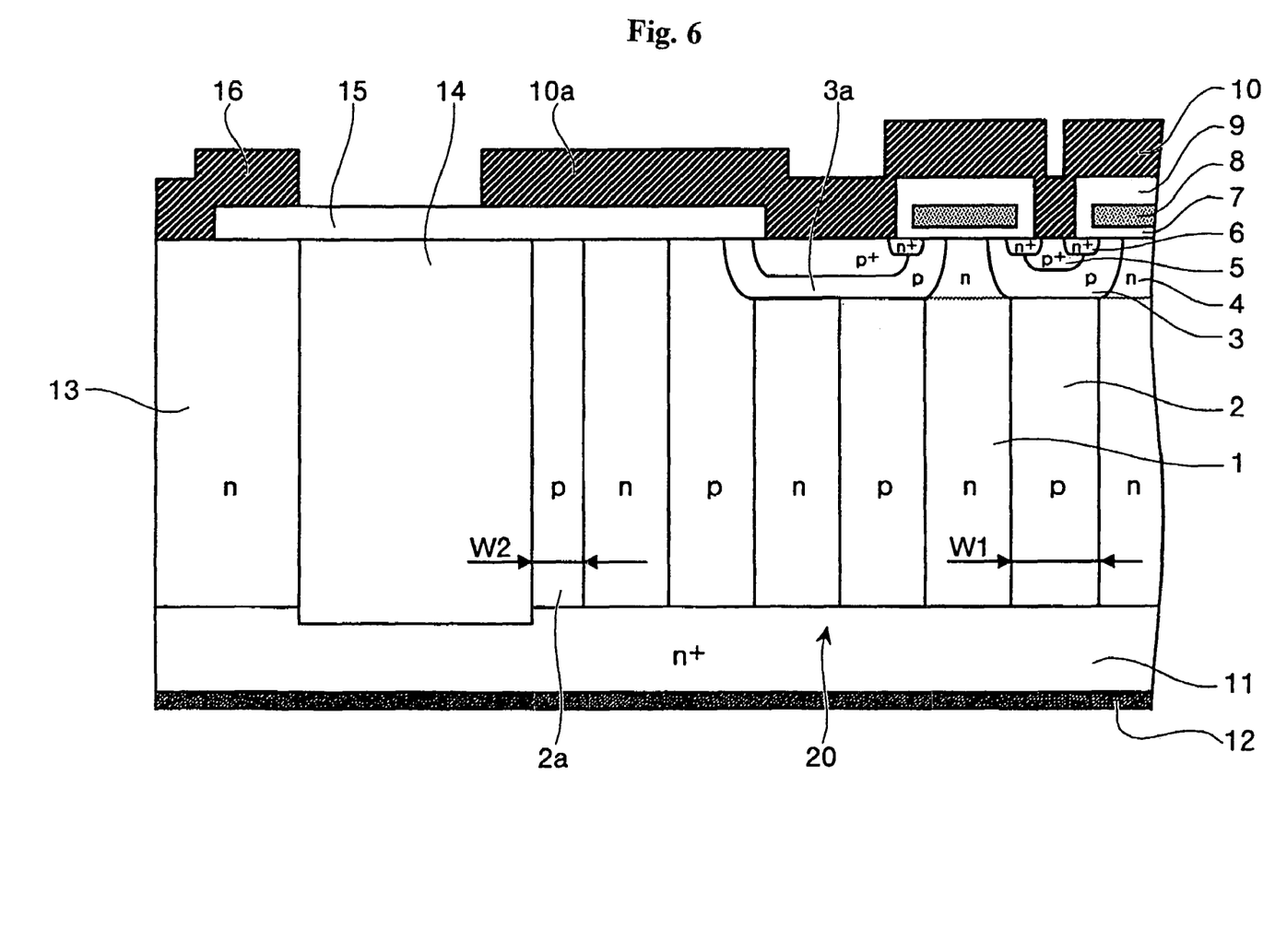
FIG. 6 is a cross sectional view showing a state of the chip cut along line C—C in FIG. 5.

FIG. 5 is a schematic view showing a chip of a vertical MOSFET according to an embodiment 3 of the invention, which is a partial plan view showing a section to which a square chip is divided into quarters. For easing understanding, there are only shown a alternating conductivity type layer (in dotted lines), an insulation region (in chain lines) surrounding the alternating conductivity type layer, and an n-type region (outside of the outer chain line) in an outermost periphery. FIG. 6 is a cross sectional view showing a section cut along line C—C in FIG. 5. As shown in FIG. 5 and FIG. 6, it is in the following three points that the embodiment 3 differs from the embodiment 1.

The first point is that the alternating conductivity type layer 20 has a plan shape in which a part facing a corner of the chip is formed in a circular-arc-like shape. The second point is that a depletion layer stopper electrode 16 is provided which is in electrically conductive contact with the n-type periphery region 13 and extends over the surface protection film 15. The third point is that a p-base region 3a positioned at the outermost side in the element active section is in no contact with the side of the insulation region 14.

According to the above first point, the alternating conductivity type layer 20 has no corners in the part facing the corner of the chip. This more reduces electric field concentration compared with the embodiment 1 and the embodiment 2 to make it possible to more easily ensure a required breakdown voltage. According to the second point, the electric potential difference of the surface protection film is fixed to the electric potential difference between the source and the drain to make it possible to ensure a stable breakdown voltage. About the third point, it is possible to provide such an arrangement.

Embodiment 4

Figure 7:
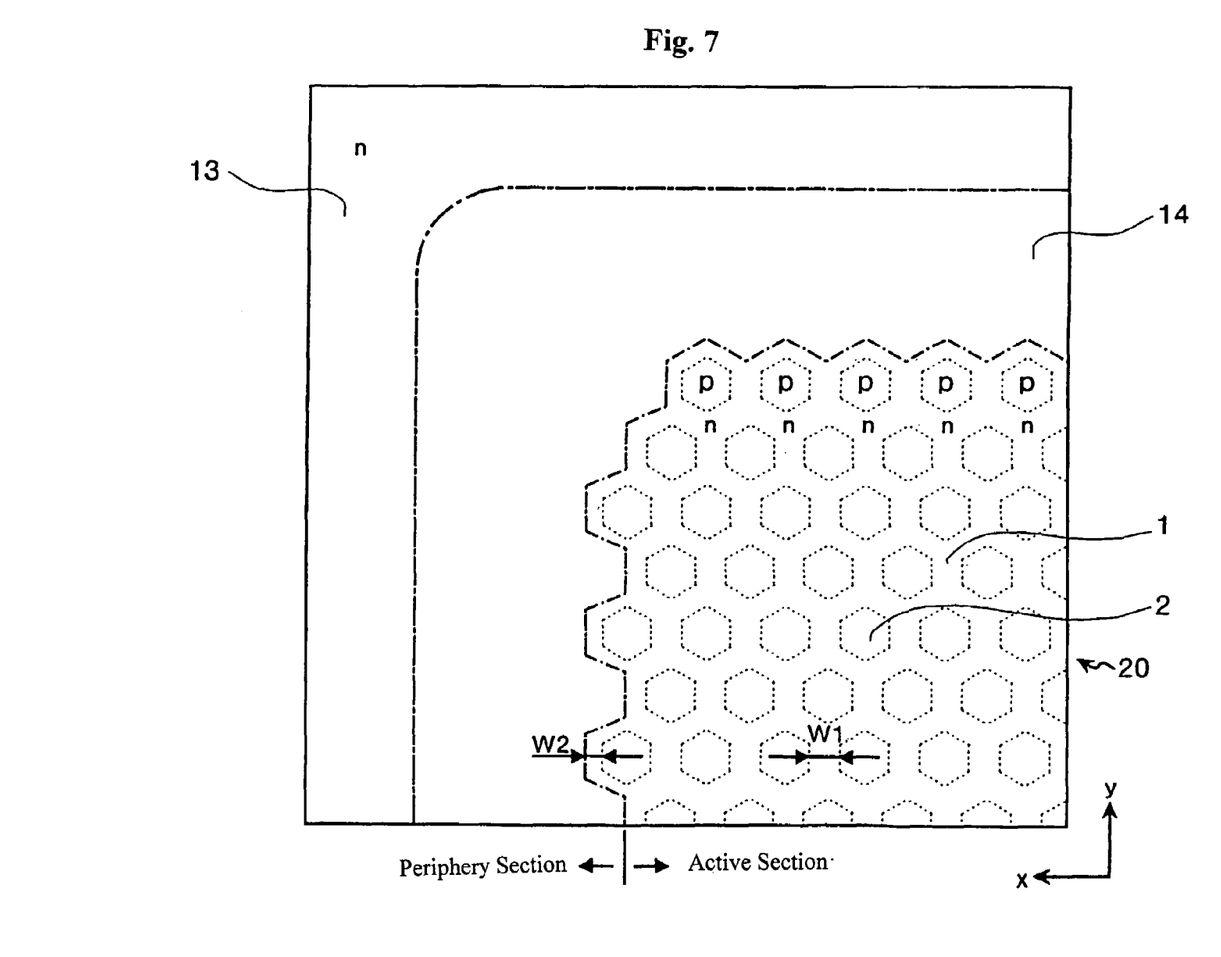
FIG. 7 is a partial plan view showing a chip of a vertical MOSFET according to a fourth embodiment of the invention.

FIG. 7 is a schematic view showing a chip of a vertical MOSFET according to an embodiment 4 of the invention, which is a partial plan view showing a section to which a square chip is divided into quarters. For easing understanding, there are only shown a alternating conductivity type layer (in dotted lines), an insulation region (in chain lines) surrounding the alternating conductivity type layer, and an n-type region (outside of the outer chain line) in an outermost periphery. In the embodiment 4, it does not matter so much which direction is taken as the x-direction or the y-direction.

As shown in FIG. 7, what the embodiment 4 differs from the embodiment 1 is that the alternating conductivity type layer 20 is not formed in a stripe-pattern-like shape but formed in a shape in which cell-like p-type partition regions 2 are arranged on their respective hexagonal lattice points in an n-type drift region 1. As another pattern, in reverse to the pattern in the example shown in FIG. 7, cell-like n-type drift regions 1 can be arranged on their respective hexagonal lattice points in a p-type partition region 2. Moreover, the n-type drift regions 1 or the p-type partition regions 2 can be arranged on lattice points of a polygonal lattice other than the hexagonal lattice such as a trigonal lattice or a tetragonal lattice. In whichever planar pattern the n-type drift region 1 or the p-type partition region 2 are arranged, a required breakdown voltage can be ensured with an arrangement in which an insulation region 14 surrounding the alternating conductivity type layer 20 is provided and, along with this, charges in the alternating conductivity type layer 20 are ensured to be made balanced at the boundary region with the insulation region 14.

In the example shown in FIG. 7, for ensuring the charges in the alternating conductivity type layer 20 to be made balanced at the boundary with the insulation region 14, the width W2 of the part of the n-type drift region 1 adjacent to the insulation region 14 is narrower than the width W1 of the n-type drift region 1 not adjacent to the insulation region 14. The width W2 is preferably between one-fourth and three-fourths the width W1. In the embodiment shown in FIG. 7, W2 is about a half of W1.

Figure 8:
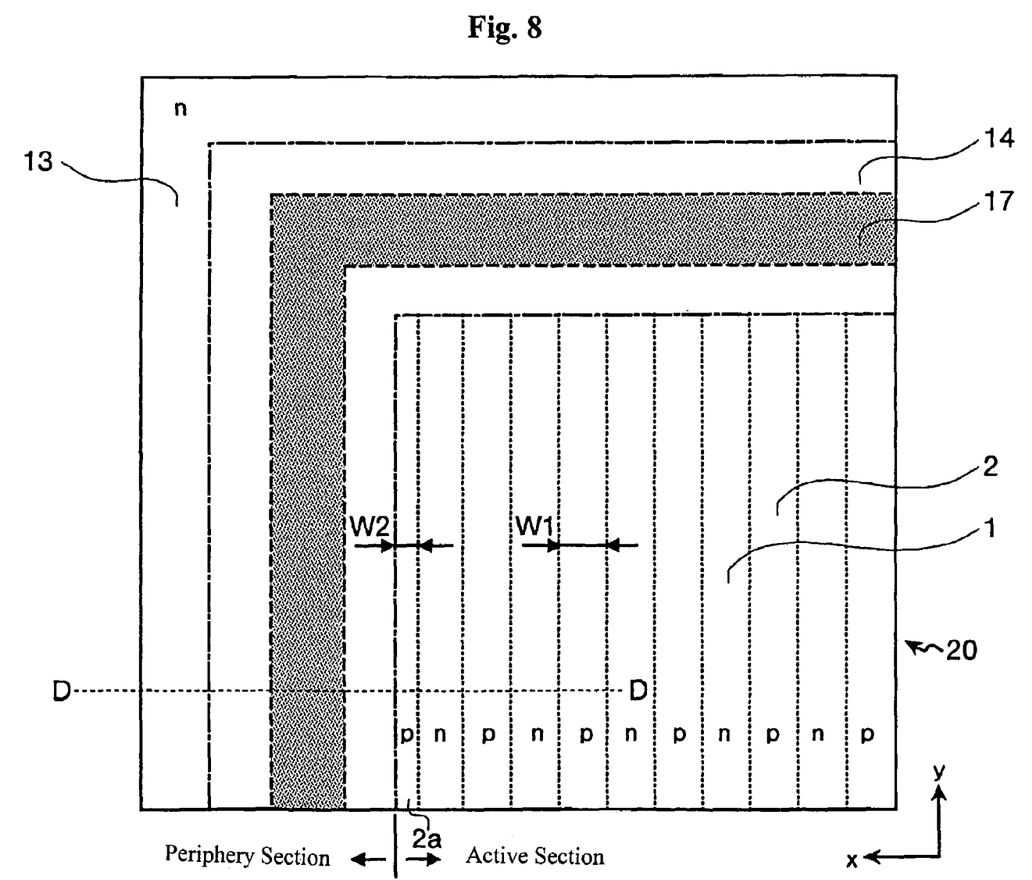
FIG. 8 is a partial plan view showing a chip of a vertical MOSFET according to a fifth embodiment of the invention.
Figure 9:
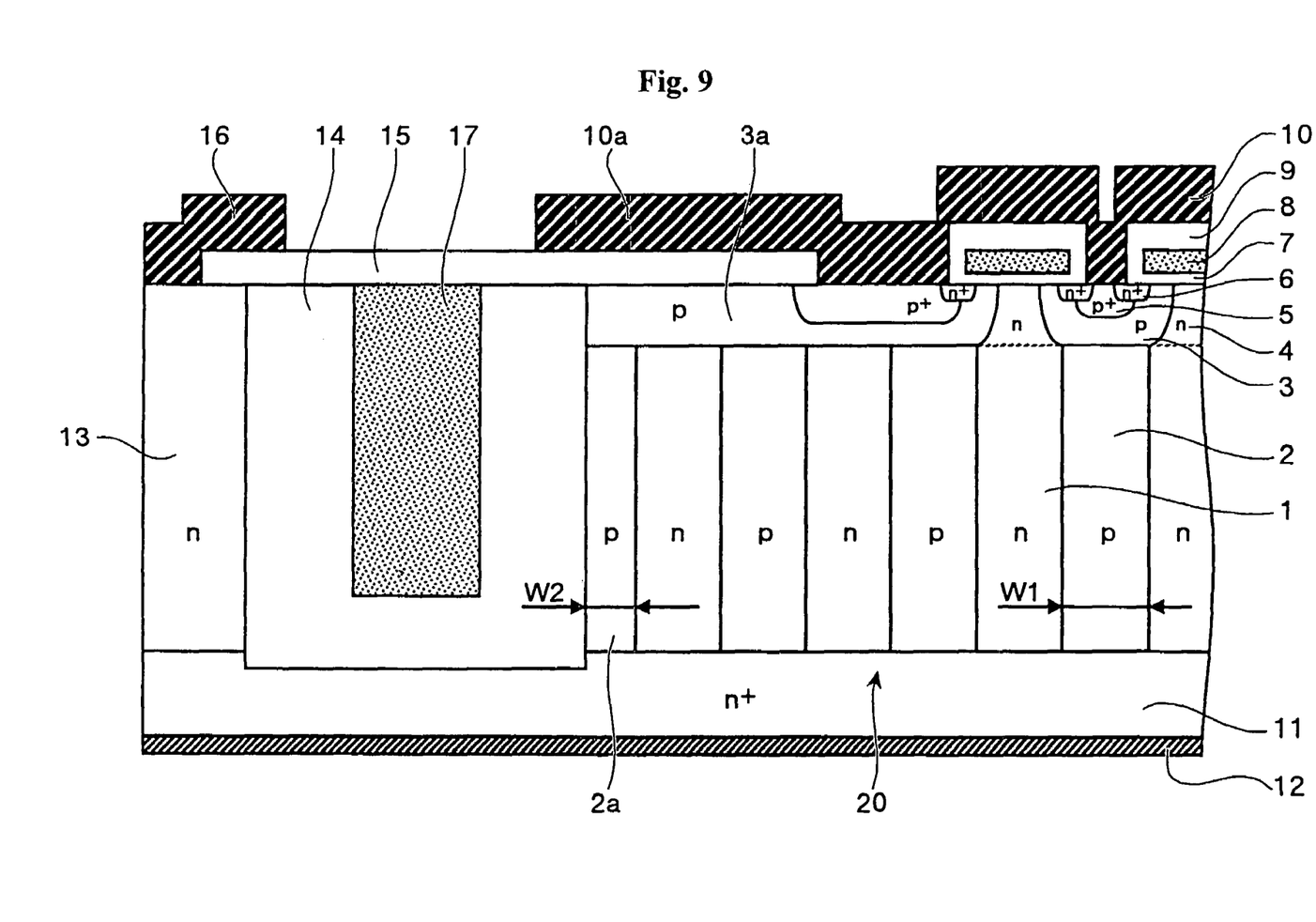
FIG. 9 is a cross sectional view showing a state of the chip cut along line D—D in FIG. 8.

FIG. 8 is a schematic view showing a chip of a vertical MOSFET according to an embodiment 5 of the invention, which is a partial plan view showing a section to which a square chip is divided into quarters. For easing understanding, there are only shown a alternating conductivity type layer (in dotted lines), an insulation region (in chain lines) surrounding the alternating conductivity type layer, a second insulation region (in broken lines) provided in the insulation region, and an n-type region (outside of the outer chain line) in an outermost periphery. FIG. 9 is a cross sectional view showing a section cut along line D—D in FIG. 8. As shown in FIG. 8 and FIG. 9, it is in the following two points that the embodiment 5 differs from the embodiment 1.

The first point is that the insulation region surrounding the alternating conductivity type layer 20 is formed in a double structure with the insulation region 14 and the second insulation region 17 provided within the insulation region 14. For example, the insulation region 14 is made of an oxide film and the second insulation region 17 is made of a nitride film. In the case with the second insulation region 17 made of a plasma nitride film, the nitride film has a smaller coefficient of thermal expansion to that of an oxide film to enhance an effect of stress relaxation against heat more than in the case with the oxide film only. Namely, only with an oxide film, an internal stress due to heat is increased. However, by embedding there a nitride film with a small coefficient of expansion, the internal stress is reduced. Therefore, there is an idea of forming the insulation region 14 only with a nitride film. However, since the critical electric field strength of the nitride film is lower than that of the oxide film, the insulation region 14 formed by embedding the nitride film only is to be provided with a width being wider compared with that of the region with the oxide film only.

The nitride film, being formed so as to be embedded in a substrate, is provided like a bank surrounding the periphery of the chip to make it possible to protect the chip from Na atoms entering the active section on the chip surface. The insulation region 14 and the second insulation region 17 can be made of an insulator film other than the oxide film and the nitride film when the critical electric field strength of the film is higher than that of silicon. The second point is that a depletion layer stopper electrode 16 is provided which is in electrically conductive contact with the n-type periphery region 13 and extends over the surface protection film 15. The second point is as was explained about the embodiment 3.

In the foregoing, the invention is not limited to the above-described embodiments but can be variously modified. For example, in the element active section, a semiconductor element other than a MOSFET can be formed. Such a semiconductor element is, for example, an IGBT, a bipolar transistor or a GTO thyristor, or a diode such as a free wheeling diode or a Schottky diode. Moreover, in the above-described embodiments, the first conductivity type and the second conductivity type are taken as an n-type and a p-type, respectively. The invention is similarly valid even when the first conductivity type and the second conductivity type are taken as a p-type and an n-type, respectively. Furthermore, the invention is applicable not only to a device of silicon semiconductor but also to that of compound semiconductor such as SiC.

As explained above, the semiconductor device according to the invention is useful for a vertical power semiconductor device in which breakdown voltage enhancement is compatible with current capacity enhancement. In particular, it is suited for a power semiconductor device such as a MOSFET, an IGBT and a bipolar transistor.

What is claimed is:

1. A semiconductor device comprising:
a first principal surface;
a second principal surface;
a low resistance layer provided between the first principal surface and the second principal surface;
an active section comprising an alternating conductivity type layer in which a plurality of first conductivity type regions and a plurality of second conductivity type regions are alternately arranged in succession in a lateral direction in parallel with the first and second principal surfaces; and
a periphery section surrounding said active section;
wherein the periphery section comprises an annular insulation region that reaches the low resistance layer from the first principal surface and that surrounds the active section on the side of the first principle surface of the substrate, wherein a width of the insulation region is wider than that of at least one of the first conductivity region and the second conductivity type region of the active section.

2. The semiconductor device as claimed in claim 1 wherein one of the first conductivity type region and the second conductivity type region adjacent to the insulation region in the alternating conductivity type layer has a width narrower than a width of a region with the same conductivity type region not adjacent to the insulation region In the alternating conductivity type layer.

3. The semiconductor device as claimed in claim 2 wherein the one of the first conductivity type region and the second conductivity type region adjacent to the insulation region in the alternating conductivity type layer has a width between one-fourth and three-fourths the width of the region with the same conductivity type not adjacent to the insulation region in the alternating conductivity type layer.

4. The semiconductor device as claimed in claim 1 wherein a part of the insulation region is covered with a field plate electrode.

5. The semiconductor device as claimed in claim 1 wherein a base region with the second conductivity type provided on the side of the first principal surface is in contact with the side of the insulation region.

6. The semiconductor device as claimed in claim 1 wherein the insulation region is surrounded by a periphery region with the first conductivity type.

7. The semiconductor device as claimed in claim 6 wherein the periphery region is in contact with the low resistance layer.

8. The semiconductor device as claimed in claim 6 wherein a region with the second conductivity type is provided between the periphery region and the first principal surface.

9. The semiconductor device as claimed in claim 6 wherein a part of the insulation region is covered with an electrode at an electric potential equal to that of the low resistance layer.

10. The semiconductor device as claimed in claim 1 wherein the insulation region adjacent to the alternating conductivity type layer has a plan shape in which a part facing a corner of the device is formed in one of a stair-like shape and a circular arc-like shape.

11. A semiconductor device comprising:
a first principal surface;
a second principal surface;
a low resistance layer provided between the first principal surface and the second principal surface;

an active section comprising an alternating conductivity type layer in which a plurality of first conductivity type regions and a plurality of second conductivity type regions are alternately arranged in succession; and a periphery section surrounding said active section;

wherein the periphery section comprises an annular insulation region that has a smaller thickness than that of the alternating conductivity type layer and that surrounds the active section on the side of the first principle surface of the substrate, wherein a width of the insulation region is wider than that of at least one of the first conductivity region and the second conductivity type region of the active section.

12. The semiconductor device as claimed in claim 11 wherein a part of the alternating conductivity type layer is formed under the insulation region.

13. The semiconductor device as claimed in claim 11 wherein a width of the first conductivity type region or the second conductivity type region adjacent to the insulation region in the alternating conductivity type layer is smaller than that of the first conductivity type region or the second conductivity type region not adjacent to the insulation region.

14. The semiconductor device as claimed in claim 11 wherein the insulation region is surrounded by a periphery region with the first conductivity type.

15. The semiconductor device as claimed in claim 14 wherein the periphery region is in contact with the low resistance layer.

16. The semiconductor device as claimed in claim 11 wherein a part of the insulation region is covered with a field plate electrode.

* * * * *